(12) United States Patent
Lee

(10) Patent No.: US 9,847,375 B2
(45) Date of Patent: Dec. 19, 2017

(54) ELECTRONIC DEVICE AND METHOD FOR FABRICATING THE SAME

(71) Applicant: SK hynix Inc., Icheon-Si (KR)

(72) Inventor: Min-Suk Lee, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 76 days.

(21) Appl. No.: 14/846,760

(22) Filed: Sep. 5, 2015

(65) Prior Publication Data

US 2016/0181316 A1    Jun. 23, 2016

(30) Foreign Application Priority Data

Dec. 17, 2014 (KR) .................... 10-2014-0182561

(51) Int. Cl.
| | |
|---|---|
| *G11C 13/04* | (2006.01) |
| *H01L 27/22* | (2006.01) |
| *H01L 27/24* | (2006.01) |
| *G06F 12/0802* | (2016.01) |
| *G06F 12/0875* | (2016.01) |
| *G11C 13/00* | (2006.01) |

(52) U.S. Cl.
CPC ........ *H01L 27/222* (2013.01); *G06F 12/0802* (2013.01); *G06F 12/0875* (2013.01); *H01L 27/2463* (2013.01); *G06F 2212/452* (2013.01); *G06F 2212/60* (2013.01); *G11C 13/0007* (2013.01); *G11C 13/04* (2013.01); *H01L 27/2436* (2013.01)

(58) Field of Classification Search
CPC ............ G11C 13/0069; G11C 13/0004; G11C 13/0007; H01L 27/2436
USPC .......................................................... 365/148
See application file for complete search history.

(56) References Cited

U.S. PATENT DOCUMENTS

| | | | |
|---|---|---|---|
| 8,278,223 B2 | 10/2012 | Kang | |
| 2014/0254239 A1* | 9/2014 | Song | ................... H01L 27/2436 365/148 |

* cited by examiner

*Primary Examiner* — Jason Lappas
(74) *Attorney, Agent, or Firm* — Perkins Coie LLP

(57) ABSTRACT

Provided is an electronic device including a semiconductor memory. The semiconductor memory may include: a substrate; a plurality of variable resistance elements formed over the substrate and arranged as a matrix, spacer patterns formed over the substrate to surround the variable resistance elements in the matrix with a thickness sufficient to define contact holes between the variable resistance elements, and a source line contact buried in the contact hole.

10 Claims, 18 Drawing Sheets

ELECTRONIC DEVICE AND METHOD FOR FABRICATING THE SAME

CROSS-REFERENCE TO RELATED APPLICATIONS

This patent document claims priority and benefits of Korean Patent Application No. 10-2014-0182561, entitled "ELECTRONIC DEVICE AND METHOD FOR FABRICATING THE SAME" and filed on Dec. 17, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the characteristics of a variable resistance element may be improved.

In an aspect, an electronic device is provided to include semiconductor memory that includes a substrate; a plurality of variable resistance elements formed over the substrate and arranged as a matrix; spacer patterns formed over the substrate to surround the variable resistance elements in the matrix with a thickness sufficient to define contact holes between the variable resistance elements in a slant direction; and a source line contact buried in the contact hole.

Implementations of the above electronic device may include one or more the following.

A thickness of the spacer patterns is configured to cover spaces between the variable resistance elements disposed in the matrix type. Each spacer pattern has a ring type suitable for surrounding the variable resistance elements. The spacer patterns comprise nitride. The variable resistance elements comprise a circular pillar type. The contact hole has a polygonal structure. The polygonal structure has a concave plane. The variable resistance element comprises transfer metal oxides, metal oxides including perovskite-based substances, phase change substances including chalcogenide-based substances, ferroelectric substances, or ferromagnetic substances.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

In another aspect, an electronic device is provided to include semiconductor memory that includes a substrate; a dielectric interlayer layer formed over the substrate; a plurality of first contact plugs formed in the dielectric interlayer layer to be electrically contact with the substrate and disposed in a matrix type; a first source line contact formed over the substrate and disposed between the first contact plugs that are arranged in a diagonal direction; a plurality of variable resistance elements disposed over the first contact plugs; spacer patterns configured to surround the variable resistance elements and defining a contact hole through which the first source line contact is exposed; and a second source line contact buried in the contact hole.

Implementations of the above electronic device may include one or more the following.

The spacer pattern has a thickness that covers spaces between the variable resistance elements disposed in the matrix type. Each of the spacer pattern has a ring type. The spacer patterns comprise a substance having etch selectivity for the dielectric interlayer layer. The spacer pattern comprises nitride. The electronic device may further comprising a second contact plug disposed over the variable resistance element. The electronic device may further comprising first and second conductive lines suitable for coming in contact with upper parts of the second contact plug and the second source line contact.

In another aspect, an electronic device is provided to include semiconductor memory that includes a substrate including a first region and a second region separated from the first region; a first dielectric interlayer layer formed over the substrate; a plurality of first contact plugs configured to come in contact with the substrate through the first dielectric interlayer layer and disposed at the first region in a matrix type; a first source line contact formed over the substrate and disposed at the first region between the diagonally arranged first contact plugs; second contact plugs suitable configured to come in contact with the substrate through the first dielectric interlayer layer and disposed at the second region; a plurality of variable resistance elements disposed at the first region over the first contact plugs; spacer patterns configured to surround the variable resistance elements and defining contact holes through which the first source line contacts are exposed; and second source line contacts each suitable for being buried in the contact hole.

Implementations of the above electronic device may include one or more the following.

The electronic device may further comprising third contact plugs formed at the first region over the variable resistance elements. The electronic device may further comprising: a second dielectric interlayer layer formed over the first dielectric interlayer layer in the second region; and a fourth contact plug formed in the second dielectric interlayer layer and configured to come in contact with the second contact plug through the second dielectric interlayer layer.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, a method of manufacturing an electronic device comprising semiconductor memory is provided. The method comprises: configuring a substrate; forming a plurality of variable resistance elements disposed in a matrix type over the substrate; forming a spacer to cover the plurality of variable resistance elements; etching a portion of the spacer to define a contact hole between the variable resistance elements that are adjacently arranged in a diagonal direction; and forming a source line contact to fill in the contact hole.

Implementations of the above electronic device may include one or more the following.

The spacer has a thickness that covers a space between the plurality of variable resistance elements disposed in the matrix type. The spacer comprises a substance having excellent step coverage. The spacer comprises nitride. The etching of the portion of the spacer includes forming a spacer pattern of a ring type surrounding a corresponding variable resistance element. The method may further comprising, before the forming of the plurality of variable resistance elements: forming a dielectric interlayer layer over the substrate; forming a plurality of first contact plugs configured to come in contact with the substrate through the dielectric interlayer layer and disposed in a matrix type; and forming a bottom source line contact disposed between the diagonally arranged first contact plugs. The method may further comprising, before the forming of the plurality of variable resistance elements: forming a plurality of first contact plugs disposed in a matrix type over the substrate; forming a dielectric interlayer layer to cover the first contact plugs; etching a portion of the dielectric layer to define a lower contact hole between the diagonally arranged first contact plugs; and forming a lower source line contact to fill in the lower contact hole. The forming of the plurality of first contact plugs comprises: forming a sacrificial layer over the substrate; etching a portion of the sacrificial layer to form a plurality of contact holes disposed in a matrix type; filling the contact holes with a conductive substance; and removing the sacrificial layer. The forming of the variable resistance elements comprises: forming a variable resistance layer over the substrate; and patterning the variable resistance layer. The forming of the variable resistance elements comprises: forming a variable resistance layer and a conductive layer over the substrate; and forming the variable resistance elements and second contact plugs by etching the variable resistance layer and the conductive layer. The method may further comprising, after forming the source line contacts, forming first and second conductive lines electrically connected the variable resistance element and the source line contact, respectively.

In another aspect, a method of manufacturing an electronic device comprising semiconductor memory is provided. The method comprises: configuring a substrate; forming a plurality of stacks over the substrate disposed in a matrix type; forming a spacer to cover the stacks; etching a portion of the spacer to form a spacer pattern surrounding a corresponding stack; forming a contact hole using the spacer pattern to self-align the contact hole, wherein the self-aligned contact hole is arranged spaced apart from adjacent stacks by a certain distance; and forming a source line contact to fill in the self-aligned contact hole.

In some implementations, the forming of the plurality of stacks including forming variable resistance elements switched between different resistance states based on a current applied to the variable resistance elements.

DETAILED DESCRIPTION

Figure 1:
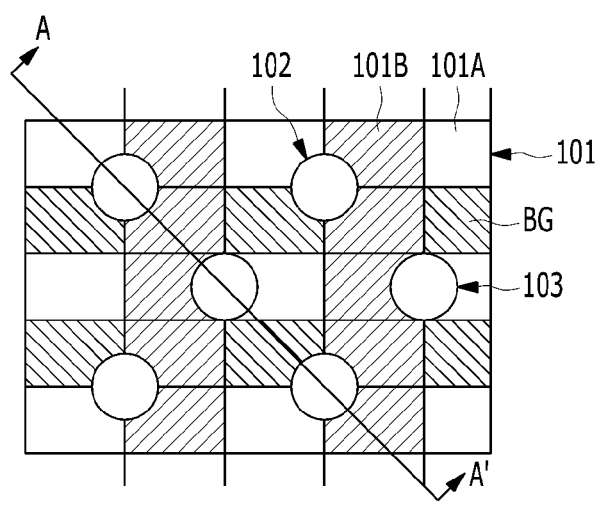
FIG. 1 is a plan view illustrating an exemplary semiconductor device in accordance with an implementation of this patent document.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a plan view illustrating a semiconductor device in accordance with an implementation of this patent document.

As illustrated in FIG. 1, isolation layers 101A may be formed in a semiconductor substrate 101, and active regions 101B of a line type may be formed in the semiconductor substrate 101. Furthermore, switching elements that include buried gates (BG) may be formed in a direction that intersects the active regions 101B. In the example of an implementation in FIG. 1, the active regions 101B and the switching elements represented by buried gates BG of a line type are illustrated, but other implementations are also possible. For example, the active region 101B may include an active region of an island type. The switching element BG may include various typed gates such as a recess type, a flat type, and a vertical type, in addition to the buried gate.

Furthermore, variable resistance elements 102 and source line contacts (SLC) 103 may be formed over the active regions 101B. In this case, the variable resistance elements 102 may be disposed or arranged in a matrix or an array. Furthermore, the variable resistance elements 102 and the source line contacts 103 may be repeatedly disposed across each other. Each of the source line contacts 103 may be disposed between a pair of the switching elements BG. Furthermore, the source line contact 103 may be disposed at specific intervals from a plurality of the variable resistance elements 102. In some implementations, along a line, for example, the line A-A' of FIG. 1, the source line contact 103 may be diagonally located between two variable resistance elements 102. In some implementations, the source line contact 103 may be diagonally located between two variable resistance elements 102 along another line, for example, the line perpendicular to the line A-A' of FIG. 1. In some implementations, the source line contact 103 may be located at the center of a square formed by four adjacent variable resistance elements 102. Thus, spacer patterns suitable for surrounding the variable resistance elements define contact holes is in slant directions with respect to the column and row directions of the array of variable resistance elements.

In the present implementation, the source line contact 103 has been illustrated to have a circle shape, but other implementations are also possible. For example, the source line contact 103 may be formed in various polygonal shapes, such as a lozenge.

Figure 2:
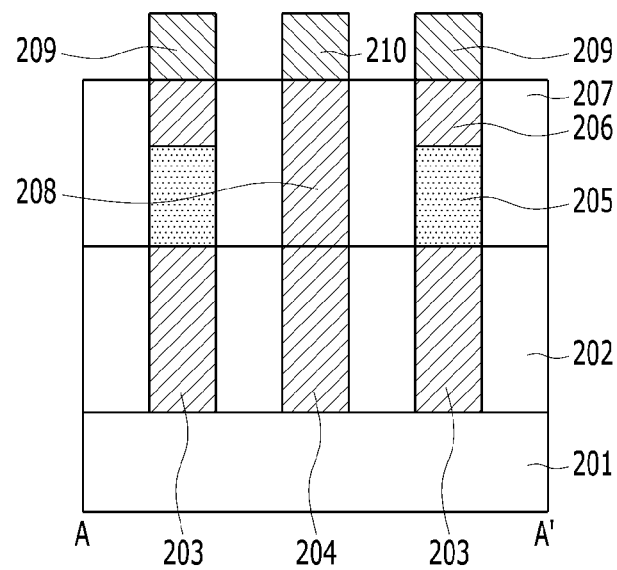
FIG. 2 is a cross-sectional view illustrating an exemplary semiconductor device in accordance with an implementation of this patent document.

FIG. 2 is a cross-sectional view illustrating an exemplary semiconductor device in accordance with an implementation of this patent document. FIG. 2 may illustrate an example of a cross section viewed in the direction A-A' of FIG. 1.

As illustrated in FIG. 2, the semiconductor device according to the present implementation may further include a substrate 201 configured to have certain required specific structures. For example, the semiconductor device may include switching elements formed in the substrate, a first dielectric interlayer layer 202 formed on the substrate 201, and first contact plugs 203 configured to penetrate the first dielectric interlayer layer 202, each electrically coupling the switching element to a resistance element 205. Furthermore, a variable resistance element 205 may be formed on the first contact plug 203. In the present implementation, the variable resistance element 205 has been illustrated as having the critical dimension the same as the first contact plug 203, but other implementations are also possible. For example, the critical dimension of the variable resistance element 205 can be controlled to be greater or smaller, if necessary. Furthermore, a second contact plug 206 may be disposed on the variable resistance element 205. The critical dimension of the second contact plug 206 may be controlled to increase or decrease, if necessary. Furthermore, a second dielectric interlayer layer 207 may be formed between the variable resistance elements 205 and the second contact plugs 206. Furthermore, first and second conductive lines 209 and 210 may be respectively disposed on the second contact plug 206 and the second source line contact 208. The first and the second conductive lines 209 and 210 may be spaced apart to have a specific interval from each other and disposed in parallel.

The switching element (not illustrated) is used to select a specific unit cell from a plurality of unit cells included in the semiconductor device and may be disposed in each unit cell.

The switching element may include transistors or diodes. The switching element may have one end electrically coupled with the first contact plug 203 and the other end electrically coupled with a first source line contact 204.

The first and the second dielectric interlayer layers 202 and 207 may include insulating materials. The first dielectric interlayer layer 202 or the second dielectric interlayer layer 207 or the both of the first dielectric interlayer layer 202 and the second didelectric interlayer layer 207 may include an oxide film or a nitride layer or the both. The first and the second dielectric interlayer layers 202 and 207 may include different types of materials depending on a deposition method. This will be further described in detail later in this patent document.

The variable resistance elements 205 may be disposed in the same manner as illustrated in the plan view of FIG. 1, that is, in a matrix type. A second source line contact 208 may be disposed to have a specific interval from four resistance elements 205.

The variable resistance element 205 may include a magnetic tunnel junction (MTJ) structure configured to include two magnetic layers (not illustrated) and a tunnel barrier layer (not illustrated) interposed between the two magnetic layers. In some implementations, the variable resistance element 205 may further include films disposed over or under the MTJ structure that can be used for various purposes. For example, the films disposed over or under the MTJ structure can be used for improving the characteristics of variable resistance elements or facilitating the process.

The variable resistance element 205 may have a characteristic switched between different resistance states depending on the magnetization directions of two magnetic layers. For example, if the two magnetic layers have the same magnetization direction (or, if the two magnetic layers are parallel to each other), they may have a low resistance state. If the two magnetic layers have different magnetization directions (or, if the two magnetic layers are semi-parallel to each other), they may have a high resistance state.

One of the two magnetic layers may be or include a pinned ferromagnetic layer having a pinned magnetization direction, and the other thereof may be or include a free ferromagnetic layer having a magnetization direction varied depending on the direction of current applied to the variable resistance element 205. The magnetic layer may include a ferromagnetic substance. For example, the ferromagnetic substance may be or include a single layer or multi-layer including an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy and may further include impurities, such as boron (B), but other implementations are also possible.

A tunnel barrier layer interposed between the two magnetic layers of the variable resistance element enables electrons to be tunneled, thereby changing the magnetization direction of the free magnetic layer. The tunnel barrier layer may be or include a single layer or multi-layer including a dielectric substance, for example, oxides, such as $Al_2O_3$, MgO, CaO, SrO, TiO, VO, or NbO, but this patent document is not limited thereto.

In another implementation, the variable resistance element 205 may include a memory device configured to store data using a variable resistance characteristic switched between different resistance states depending on a voltage or current applied thereto. The variable resistance element 205 may include two electrodes configured to apply a voltage or current and a variable resistance substance interposed between the two electrodes. In this case, the variable resistance substance may include a single layer or multi-layer including various substances used in RRAM, PRAM, FRAM, or MRAM. Such various substances may include, for example, transfer metal oxides, metal oxides such as perovskite-based substances, phase change substances such as chalcogenide-based substances, ferroelectric substances, or ferromagnetic substances.

The first and the second contact plugs 203 and 206, the first and the second source line contacts 204 and 208, and the first and the second conductive lines 209 and 210 may include a semiconductor layer or a metallic layer. The first contact plug 203 may function as the bottom electrode contact (BEC) of the variable resistance element 205. The second contact plug 206 may function as the top electrode contact (TEC) of the variable resistance element 205.

The first contact plugs 203 and the second contact plugs 206 may be disposed in the same manner as the variable resistance elements 102 illustrated in FIG. 1, that is, in a matrix type. In some implementations, the first source line contact 204 may be disposed between the four first contact plugs 203 and spaced apart from the four first contact plugs 203 at a specific interval.

In the present implementation, the source line contact may be formed to include the first source line contact 204 and the second source line contact 208 that are separately formed from each other. In this case, the first and the second source line contacts 204 and 208 may be disposed in the same deployment as the source line contacts 103 of FIG. 1. For example, the first and the second source line contacts 204 and 208 may be disposed to have a specific interval from a plurality of the first contact plugs and/or the variable resistance elements. In some implementations, the first source line contact 204 and/or the second source line contact 208 may be formed through a self-alignment instead of a mask process. This will be described in detail with regard to subsequent processes.

FIGS. 3a to 3f are cross-sectional views illustrating an example of a method for fabricating a semiconductor device in accordance with an implementation of the disclosed technology. FIGS. 4a to 4f are plan views illustrating a method for fabricating a semiconductor device in accordance with an implementation of the disclosed technology. In order to help understanding, FIGS. 3a to 3f are discussed below together with FIGS. 4a to 4f. It is to be noted that the same reference numeral denotes the same region.

Figure 3A:
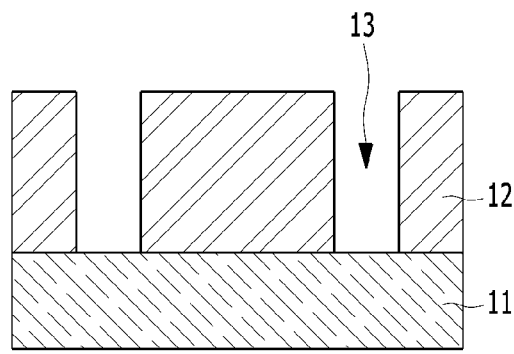
FIGS. 3A through 3F are cross-sectional views illustrating an example of a method for fabricating a semiconductor device in accordance with an implementation of this patent document.
Figure 4A:
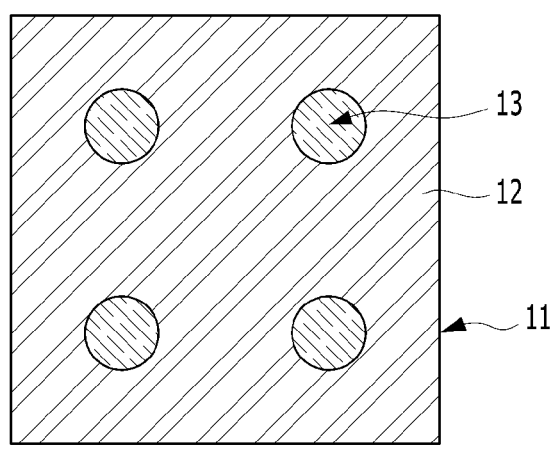
FIGS. 4A through 4F are plan views illustrating an example of a method for fabricating a semiconductor device in accordance with an implementation of this patent document.

As illustrated in FIGS. 3A and 4A, a sacrificial layer 12 may be formed on a substrate 11. The sacrificial layer 12 may include a substance that can be easily removed by wet or dry etch. The sacrificial layer 12 may include a substance having a different etching selectivity from those of the substrate 11 and pillar patterns to be formed in a subsequent process.

Contact holes 13 that penetrate the sacrificial layer 12 and expose portions of the substrate 11 may be formed. The contact holes 13 may be arranged to be spaced apart from one another by a specific interval. The contact holes 13 may be arranged in a matrix type in a first direction (upward or downward directions) and a second direction (leftward or rightward directions).

Figure 3B:
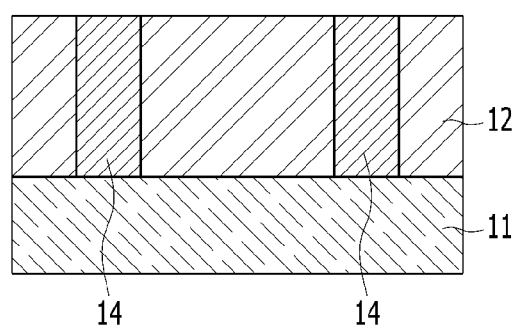
Figure 4B:
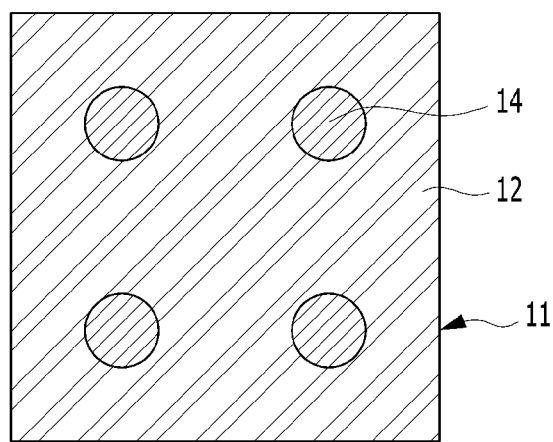

As illustrated in FIGS. 3B and 4B, pillar patterns 14 buried in the respective contact holes 13 may be formed. The pillar patterns 14 may be formed by a series of processes including burying or filling the contact holes 13 with a conductive substance and electrically separating the pillar patterns 14. The separation process may be performed using a method for etching or polishing a conductive substance formed on the surface (e.g., the entire surface) using a blanket etch (e.g., etch-back) or chemical mechanical polishing process until the sacrificial layer 12 is exposed.

In the present implementation, the pillar patterns 14 made of or including the conductive substance have been illustrated, but this patent document is not limited thereto. The pillar patterns 14 may be made of or include any substance, if necessary. Furthermore, in the present implementation, the pillar patterns have been illustrated as being formed by burying the contact holes with the conductive substance. However, other implementations are also possible. For example, the pillar patterns may be formed by other suitable techniques such as deposition and patterning.

Figure 3C:
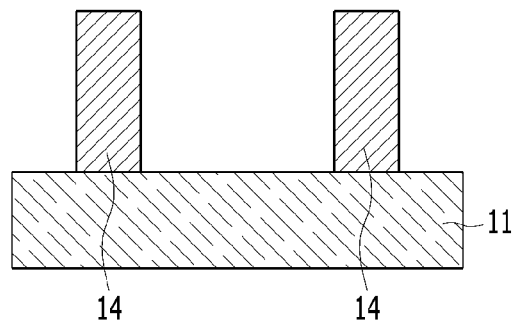
Figure 4C:
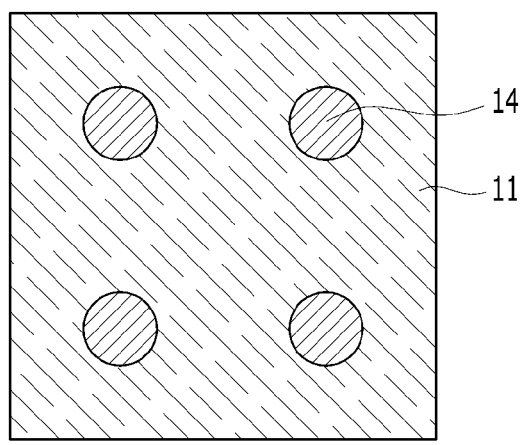

As illustrated in FIGS. 3C and 4C, the sacrificial layer 12 (refer to FIG. 3B) may be removed. Accordingly, only the pillar patterns 14 disposed in a matrix type may remain on the substrate 11.

Figure 3D:
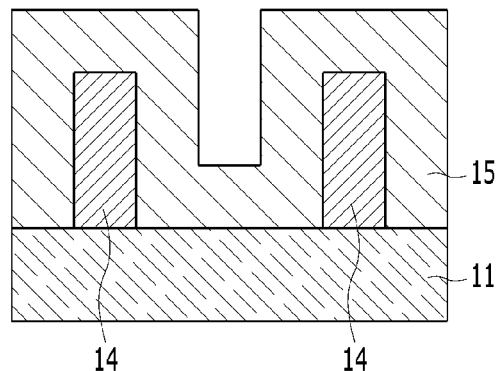
Figure 4D:
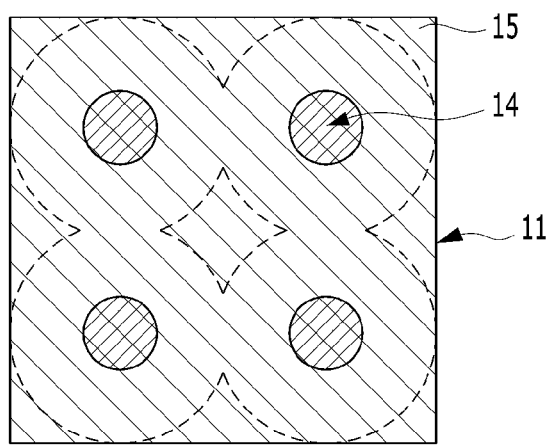

As illustrated in FIGS. 3D and 4D, spacers 15 may be formed to cover the structure including the pillar patterns 14. In some implementations, each of the spacers 15 may be formed to have a thickness to fill or cover spaces between adjacent pillar patterns that are disposed in a matrix type along the first and the second directions. For example, a pillar pattern is arranged such that adjacent pillar patterns are arranged at the upper and lower and left and right sides of the pillar patterns. The spacer 15 may include a substance having excellent step coverage. The spacer 15 may include a substance having etch selectivity with regard to the pillar patterns 14 and the substrate 11. The spacers 15 may include a nitride, for example.

Figure 3E:
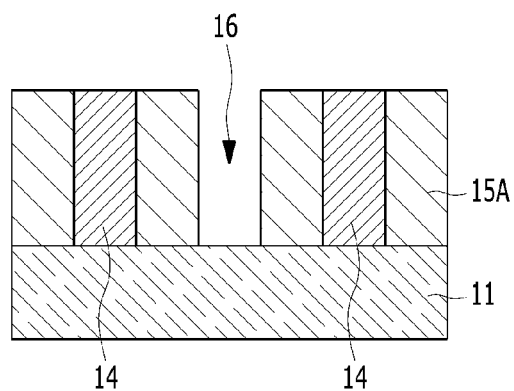
Figure 4E:
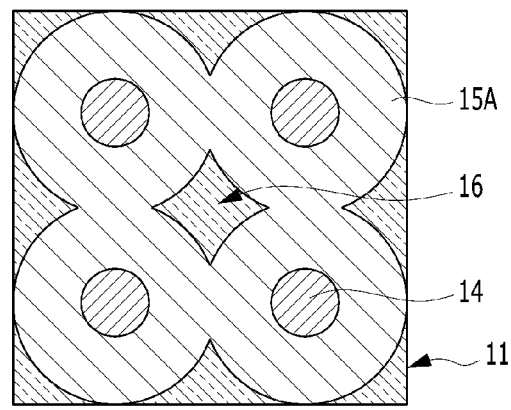

As illustrated in FIGS. 3E and 4E, spacer patterns 15A are formed by etching a portion of the spacers 15 (refer to FIG. 3D). In some implementations, the spacer patterns 15A may remain only on the sidewalls of the pillar patterns 14. In some implementations, the spacer patterns 15A may have a ring type and surround the circumferences of the pillar patterns 14, as illustrated in FIG. 4E. Since the spacer patterns 15A with a ring type bury or cover the space between the pillar patterns 14 that are disposed in a matrix type, a groove 16 may be formed at the center of the adjacent four pillar patterns 14 to expose the substrate 11. The groove 16 may be formed to have a polygonal structure in the plan view when viewed from the top. In this case, each of the sides of the groove that forms a polygon may have a concave surface. The groove 16 may be disposed to have the same interval from the four pillar patterns 14.

Figure 3F:
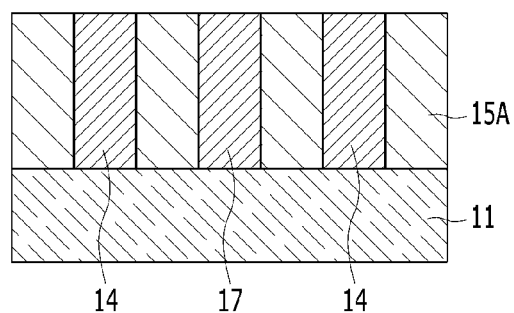
Figure 4F:
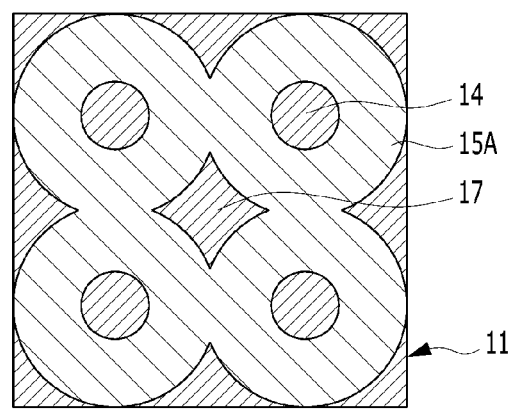

As illustrated in FIGS. 3F and 4F, contact plugs 17 may be formed by burying the grooves 16 with a conductive substance. The contact plugs 17 may be formed using a series of processes for burying the grooves 163 with the conductive substance and electrically separating adjacent contact plugs 17. The separation process may be performed using a method of etching or polishing the conductive substance on the surface using a blanket etch (e.g., etch-back) or chemical mechanical polishing process until the spacer patterns 15A are exposed.

As described above, in the present implementation, the contact plugs 17 are formed through a self-alignment process using the pillar patterns 14 and the spacer patterns 15A. Accordingly, a mask process for forming the contact plugs 17 can be omitted, and a misalignment problem that may be caused by performing a mask process can be prevented. The contact plugs 17 may be repeatedly disposed across the pillar patterns 14.

In order to help the understanding of some implementations of the disclosed technology, the contact plugs 17 and the pillar patterns 14 have been described as separate elements assigned different names and illustrated, but the contact plugs 17 and the pillar patterns 14 may be made of or include the same substance and may perform the same function. In some implementations, after forming the pillar patterns 14, pillar patterns (or contact plugs) having double density may be formed through a self-alignment process using the spacer patterns 15A. Accordingly, a margin of a mask process for forming patterns can be secured, and patterns that exceed the resolution limit can be formed.

FIGS. 5A to 5G are cross-sectional views illustrating a method for fabricating a semiconductor device in accordance with another implementation of this patent document.

Figure 5A:
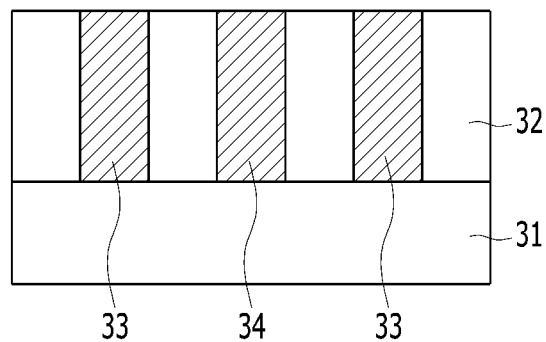
FIGS. 5A through 5G are cross-sectional views illustrating an example of a method for fabricating a semiconductor device in accordance with another implementation of this patent document.

As illustrated in FIG. 5A, a dielectric interlayer layer 32 may be formed on a substrate 31. Furthermore, first contact plugs 33 and first source line contacts 34 may be formed to penetrate the dielectric interlayer layer 32. The first contact plugs 33 and the first source line contact 34 may be in contact with the substrate 31.

The substrate 31 may include a semiconductor substrate. The substrate 31 may further include certain switching elements (not illustrated).

The dielectric interlayer layer 32 may include insulating materials. The dielectric interlayer layer 32 may include oxides, oxynitrides, or nitrides. The dielectric interlayer layer 32 may have a single layer structure or multi-layer structure.

In some implementations, the first contact plugs 33 and the first source line contacts 34 may be simultaneously formed through a single mask process. Alternatively, the first contact plugs 33 and the first source line contacts 34 may be formed by separate processes. In some implementations, the first contact plugs 33 and the first source line contacts 34 may also be formed through the self-alignment process illustrated in FIGS. 3a to 3f.

The first contact plugs 33 may be disposed in the same deployment as the switching elements (refer to 102 of FIG. 1), that is, in a matrix type. The first source line contacts 34 may be disposed in the same deployment as the source line contacts (refer to 103 of FIG. 1). Each of the first source line contacts 34 may be formed at the center of the four first contact plugs 33 and spaced apart from the first contact plugs 33 by a specific interval. The first contact plugs 33 and the first source line contacts 34 may be repeatedly disposed across each other i as shown in FIG. 1. In some implementations, the first contact plugs 33 and the first source line contacts 34 may be repeatedly and alternately disposed in a diagonal direction.

The first contact plug 33 and the first source line contact 34 may include a semiconductor layer or a metallic layer. The first contact plugs 33 may function as the bottom electrode contacts (BEC) of a resistance element to be formed in a subsequent process.

Figure 5B:
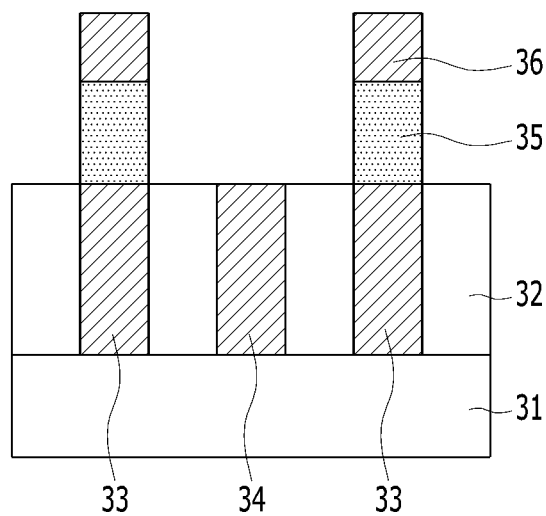

As illustrated in FIG. 5B, variable resistance elements 35 and second contact plugs 36 may be formed on the first contact plugs 33.

The variable resistance elements 35 and the second contact plugs 36 may be formed in a pillar type by depositing a variable resistance layer and a conductive substance on the structure (e.g., the entire structure), including the first contact plugs 33, and patterning the variable resistance layer and the conductive substance to have the same critical dimension as the first contact plugs 33. In the present implementation, the variable resistance elements 35 and the second contact plugs 36 have been illustrated as having the same critical dimension as the first contact plugs 33, but this patent document is not limited thereto. The critical dimension of each of the elements including the variable resistance elements 35, the second contact plugs 36 and the first contact plugs 33 may be controlled, if necessary.

Each of the second contact plugs 36 may function as the top electrode contact (TEC) of the variable resistance element 35. The second contact plug 36 may also function as the top electrode of the variable resistance element 35 or the etch mask of the variable resistance element 35. The second contact plug 36 may include a semiconductor layer or a metallic layer.

The variable resistance element 35 may include a magnetic tunnel junction (MTJ) structure configured to include two magnetic layers (not illustrated) and a tunnel barrier layer (not illustrated) interposed between the two magnetic layers. The variable resistance element 35 may further include films disposed over and/or under the MTJ structure. The films of the variable resistance element 35 may be used for various purposes. For example, the films may be used for improving the characteristics of variable resistance elements or facilitating the process.

In another implementation, the variable resistance element 35 may include a memory device configured to store data using a variable resistance characteristic switched between different resistance states depending on a voltage or current applied thereto. The variable resistance element 35 may include two electrodes configured to apply a voltage or current and a variable resistance substance interposed between the two electrodes. In this case, the variable resistance substance may include a single layer or multi-layer including various substances used in RRAM, PRAM, FRAM, or MRAM. Such various substances may include, for example, transfer metal oxides, metal oxides, such as perovskite-based substances, phase change substances, such as chalcogenide-based substances, ferroelectric substances, or ferromagnetic substances.

The variable resistance elements 35 may be spaced apart from one another by a specific interval along the first and second directions. One example of the arrangement of the variable resistance elements 35 is provided I FIG. 1 where the variable resistance elements 102 in FIG. 1 are arranged in a matrix type along the vertical and horizontal directions.

For convenience of description, hereinafter, the variable resistance element 35 and the second contact plug 36 are collectively called as stacks 35 and 36 and explained together.

Figure 5C:
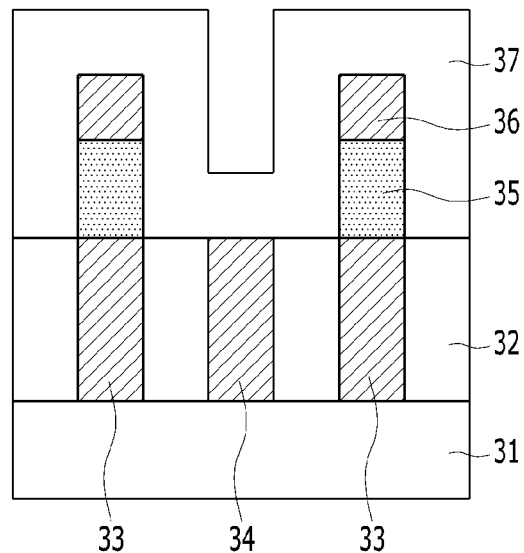

As illustrated in FIG. 5C, a spacer 37 may be formed on the structure including the stacks 35 and 36. In some implementations, the spacer 37 may be formed to a thickness that buries a space between adjacent stacks 35 and 36 disposed in a matrix type. The spacer 37 may include a substance having excellent step coverage. The spacer 37 may include a substance having etch selectivity for the second contact plugs 36, the first source line contacts 34, and the dielectric interlayer layer 32. The spacer 37 may include a nitride, for example.

Figure 5D:
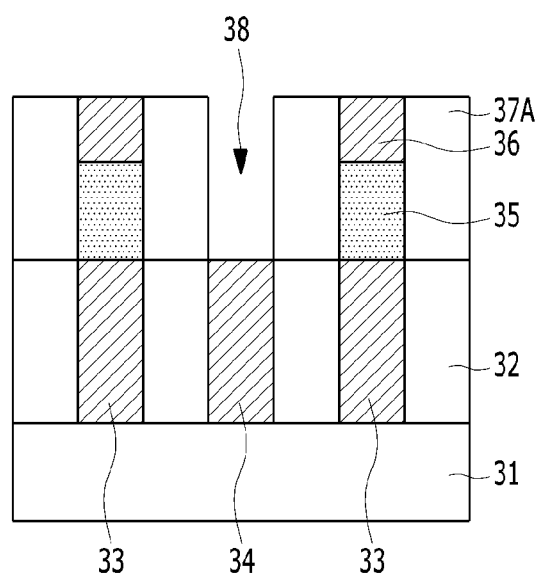

As illustrated in FIG. 5D, spacer patterns 37A remaining only on the sidewalls of the stacks 35 and 36 may be formed by etching the spacer 37 (refer to FIG. 5C). The spacer pattern 37A may be configured to surround the circumferences of the stacks 35 and 36 in a ring type. Since the spacer pattern 37A of a ring type buries or covers spaces between the stacks 35 and 36 disposed in a matrix type at four sides, for example, the upper and lower and left and right sides, a groove 38 through which the first source line contacts 34 are exposed may be formed at the center of the four stacks 35 and 36. The groove 38 may be formed to have a lozenge. The groove 38 may be disposed to have the same interval from the four stacks 35 and 36.

Figure 5E:
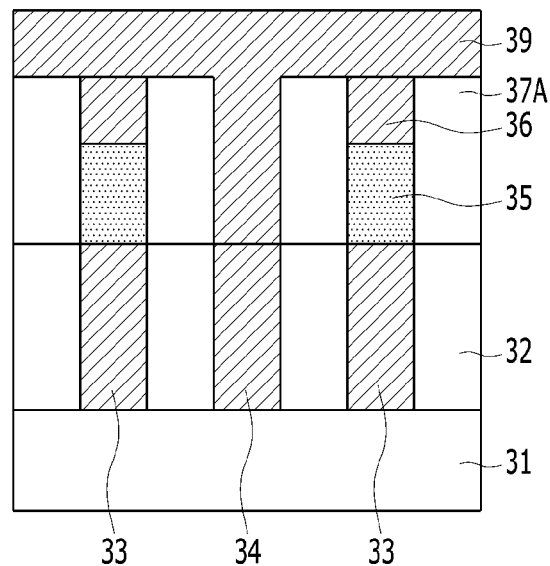

As illustrated in FIG. 5E, a conductive substance 39 that buries the grooves 38 may be formed. The conductive substance 39 may include the same substance as the first source line contacts 34.

Figure 5F:
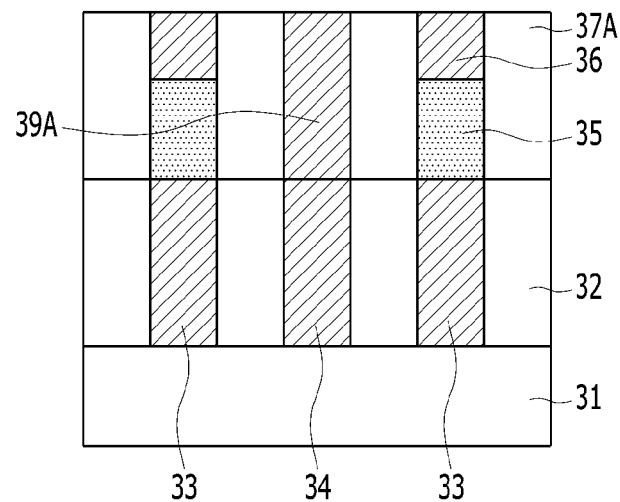

As illustrated in FIG. 5F, second source line contacts 39A may be formed by etching the conductive substance 39 (refer to FIG. 5E). The etch process for forming the second source line contacts 39A may be performed as a separation process. The separation process may be performed using a method of etching or polishing the conductive substance 39 formed on the structure (e.g., the entire structure) using a blanket etch (e.g., etch-back) or chemical mechanical polishing process until the spacer patterns 37A are exposed.

As described above, in the present implementation, the second source line contacts 39A are formed through a self-alignment process using the stacks 35 and 36 and the spacer patterns 37A. Accordingly, a mask process for forming the second source line contacts 39A can be omitted, and a misalignment problem that is caused when performing a mask process can also be prevented. The second source line contacts 39A may be repeatedly disposed across the variable resistance elements 35, as illustrated in FIG. 1.

Figure 5G:
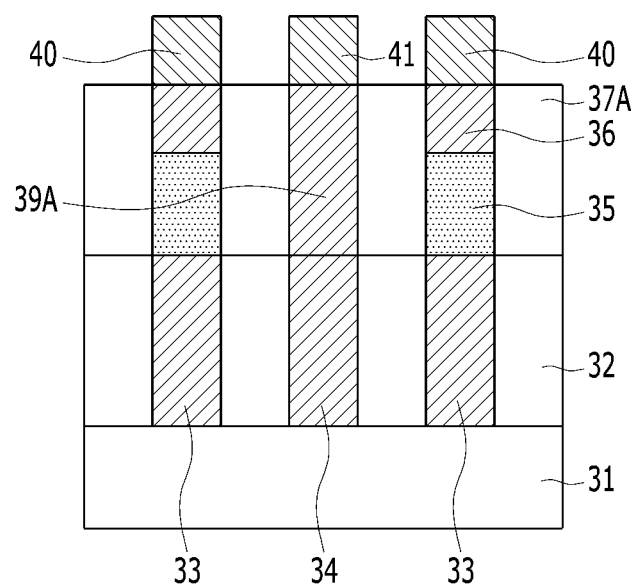

As illustrated in FIG. 5G, first and second conductive lines 40 and 41 may be respectively formed on the second contact plug 36 and the second source line contact 39A. The first and the second conductive lines 40 and 41 may be disposed to come in contact with the second contact plug 36 and the second source line contact 39A. The first and the second conductive lines 40 and 41 may be spaced apart from each other by a specific interval and disposed in parallel.

As described above, in the present implementation, a process margin according to a reduction of an etch target can be secured because the first source line contacts 34 and the second source line contacts 39A are divided and formed. Furthermore, a process margin according to the omission of a mask process can be secured if the first and the second source line contacts 34 and 39A are formed by a self-alignment process.

FIGS. 6A to 6H are cross-sectional views illustrating a method for fabricating a semiconductor device in accordance with yet another implementation of this patent document.

Figure 6A:
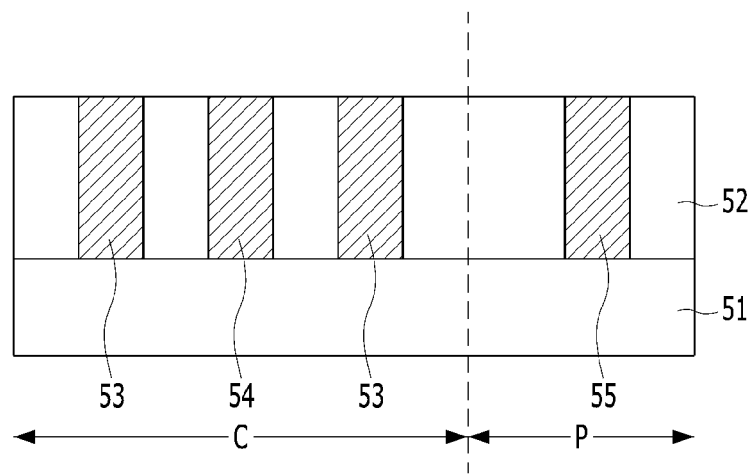
FIGS. 6A through 6H are cross-sectional views illustrating an example of a method for fabricating a semiconductor device in accordance with yet another implementation of this patent document.

As illustrated in FIG. 6A, a first dielectric interlayer layer 52 may be formed on a substrate 51 including a first region C and a second region P. The first region C may include a cell region, and the second region P may include a peripheral region. The substrate 51 in the first region C may include switching elements (not illustrated).

First contact plugs 53, first source line contacts 54, and second contact plugs 55 may be formed to penetrate the first dielectric interlayer layer 52 in the first region C and the second region P and come in contact with the substrate 51. The first contact plugs 53, the first source line contacts 54, and the second contact plugs 55 may be formed by a series of processes including forming contact holes through which the substrate 51 is exposed through the first dielectric interlayer layer 52, forming a conductive substance on the structure so that the contact holes are gap-filled, and electrically separating the conductive substances spaced between adjacent contact holes. The separation process may be performed using a method for etching or polishing a conductive substance formed on the surface (e.g., the entire surface) using a blanket etch (e.g., etch-back) or chemical mechanical polishing process until the first dielectric interlayer layer 52 is exposed.

In this case, the first contact plugs 53 in the first region C may be disposed in a matrix type like the variable resistance elements 102 of FIG. 1. Furthermore, the first contact plugs 53 and the first source line contacts 54 may be formed through the self-alignment process as illustrated in FIGS. 3a to 3f. Furthermore, the first contact plugs 53, the first source line contacts 54, and the second contact plugs 55 may be separately formed through by a series of processes.

Figure 6B:
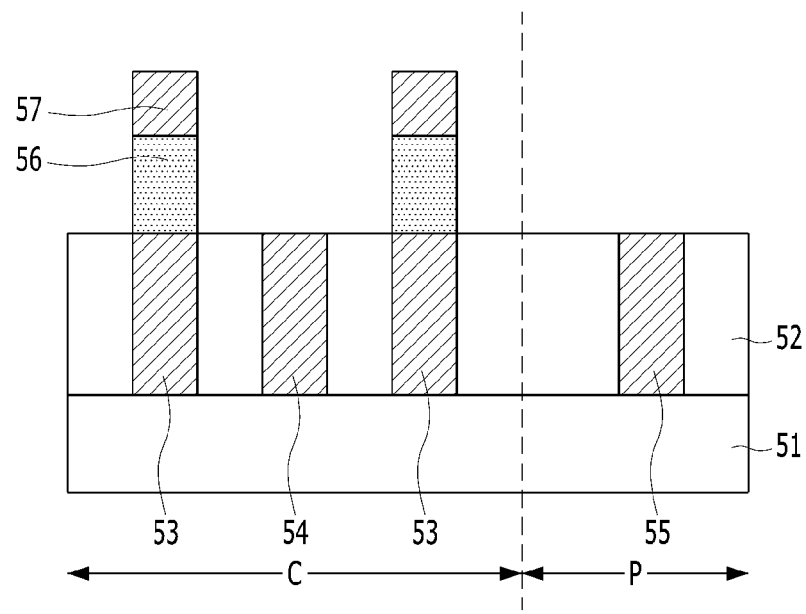

As illustrated in FIG. 6B, a variable resistance element 56 and a second contact plug 57 may be formed over each of the first contact plugs 53 in the first region C. The variable resistance elements 56 and the second contact plugs 57 may be formed through the same process as that illustrated in FIG. 5B.

For convenience of description, hereinafter, the variable resistance element 56 and the second contact plug 57 are collectively called as stacks 56 and 57 and explained together.

Figure 6C:
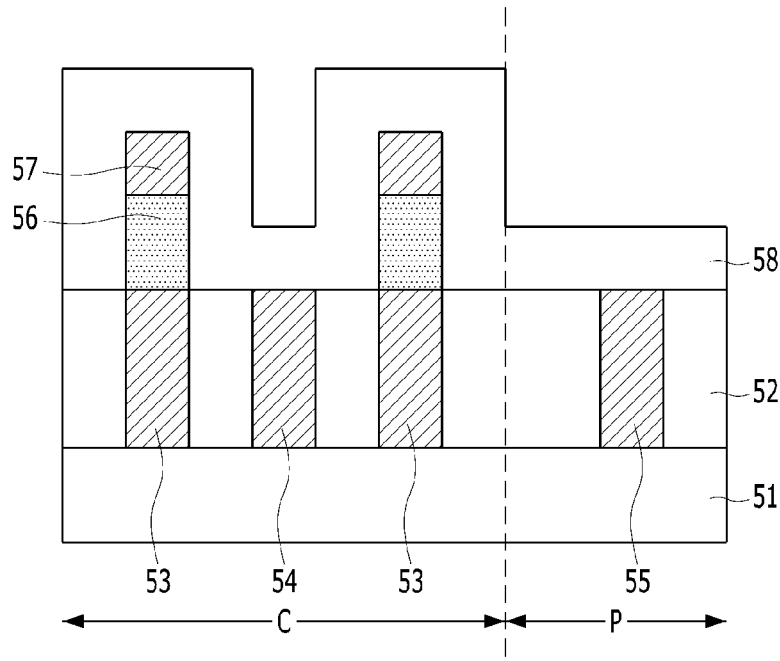

As illustrated in FIG. 6C, a spacer 58 may be formed on the structure including the stacks 56 and 57. The spacer 58 may be formed through the same process as that illustrated in FIG. 5c.

Figure 6D:
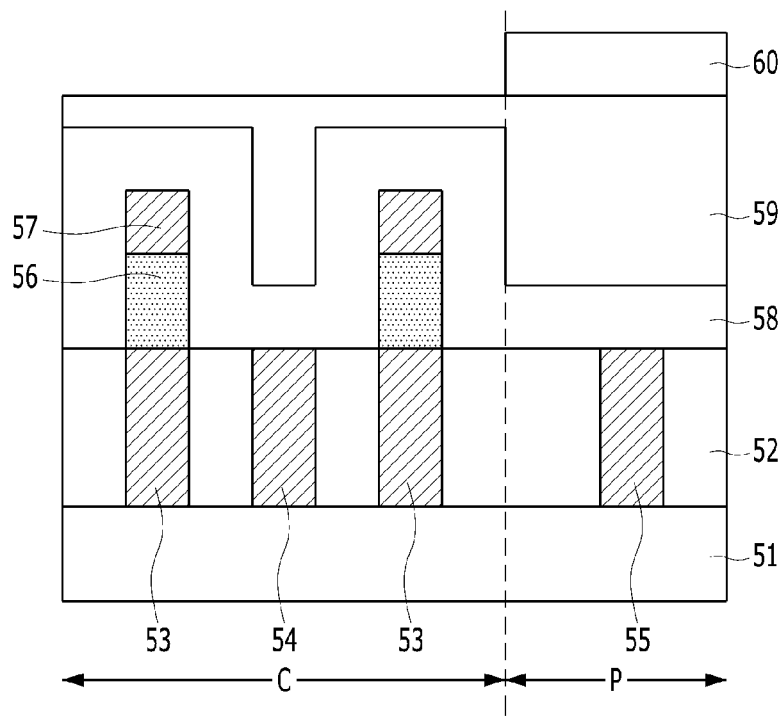

As illustrated in FIG. 6D, a second dielectric interlayer layer 59 may be formed on the spacer 58. The second dielectric interlayer layer 59 may be formed to a thickness that buries or covers a space between all the steps due to the spacer 58. The second dielectric interlayer layer 59 may include a substance having etch selectivity with regard to the spacer 58. The second dielectric interlayer layer 59 may include insulating materials. The second dielectric interlayer layer 59 may include oxide or oxynitride, for example.

Thereafter, a mask pattern 60 through which the first region C is open may be formed on the second dielectric interlayer layer 59 in the second region P. In the present implementation, the second dielectric interlayer layer 59 has been illustrated as having a higher surface step than the spacer 58, but a planarization process may be further performed before forming the mask pattern 60 so that the second dielectric interlayer layer 59 has the same surface step as the spacer 58.

Figure 6E:
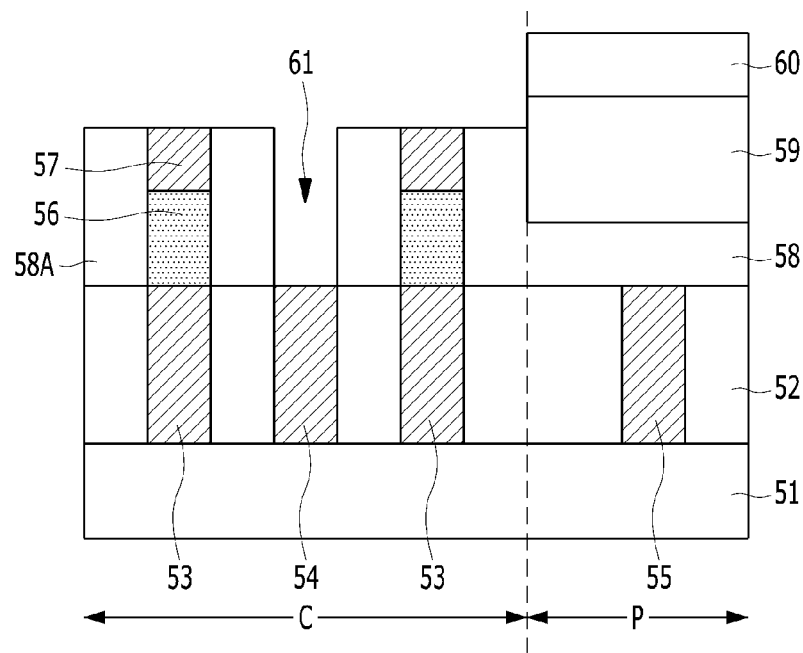

As illustrated in FIG. 6E, the second dielectric interlayer layer 59 in the first region C may be removed. The second dielectric interlayer layer 59 may be removed by dry etch or wet etch.

Thereafter, spacer patterns 58A that remain on the sidewalls of the stacks 56 and 57 may be formed by etching the spacer 58 (refer to FIG. 6D). In this case, the second dielectric interlayer layer 59 and the spacer 58 in the second region P may be protected by the mask pattern 60 and thus may remain intact without being damaged.

The spacer patterns 58A in the first region C may be formed through the same process as that for forming the spacer patterns as illustrated in FIG. 5d. Accordingly, a groove 61 through which the first source line contact 54 is exposed may be formed at the center of the four stacks 56 and 57 because the spacer pattern 58A of a ring type buries spaces between the stacks 56 and 57 disposed in a matrix type at four sides, for example, the upper and lower and left and right sides in the first region C. The groove 61 may be formed in a lozenge. The groove 61 may be disposed to have the same interval from the four stacks 56 and 57.

Figure 6F:
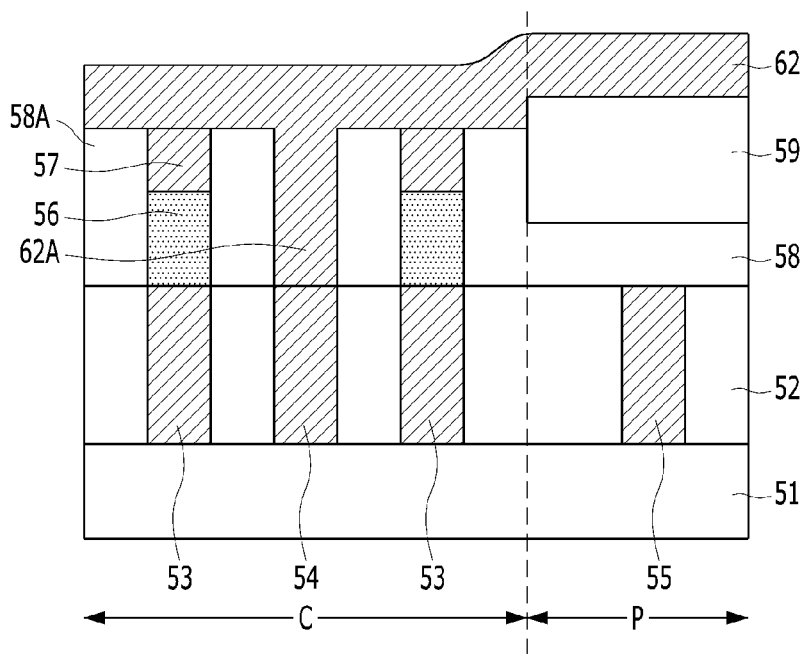

As illustrated in FIG. 6F, the mask pattern 60 may be removed. If the mask pattern 60 is a photosensitive film, it may be removed by dry strip.

Thereafter, a conductive substance 62 that buries the grooves 61 in the first region C may be formed. The conductive substance 62 may include the same substance as the first source line contacts 54.

Figure 6G:
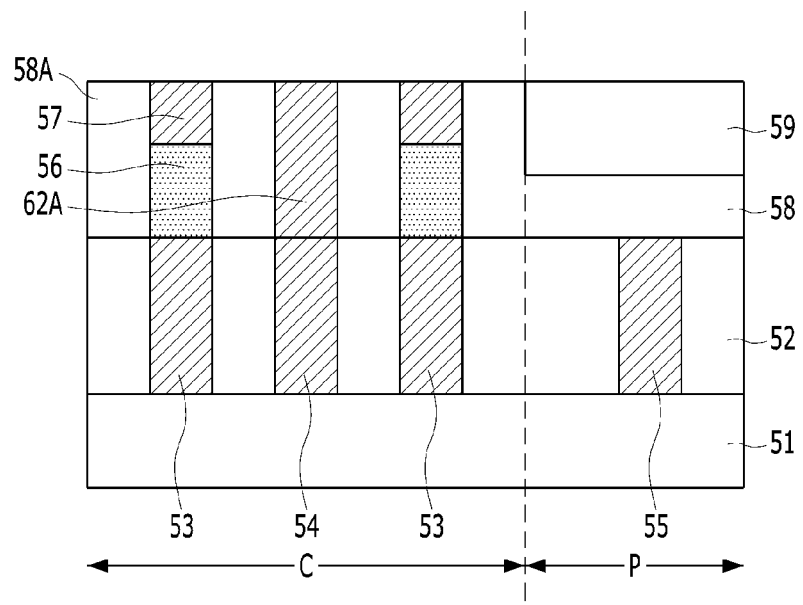

As illustrated in FIG. 6G, second source line contacts 62A may be formed in the first region C by etching the conductive substance 62 (refer to FIG. 6F). The second source line contacts 62A may be formed through the same process as that illustrated in FIG. 5f.

In a separation process for forming the second source line contacts 62A, additional etch may be performed so that the second dielectric interlayer layer 59 in the second region P has the same surface step as the spacer patterns 58A of the first region C.

Figure 6H:
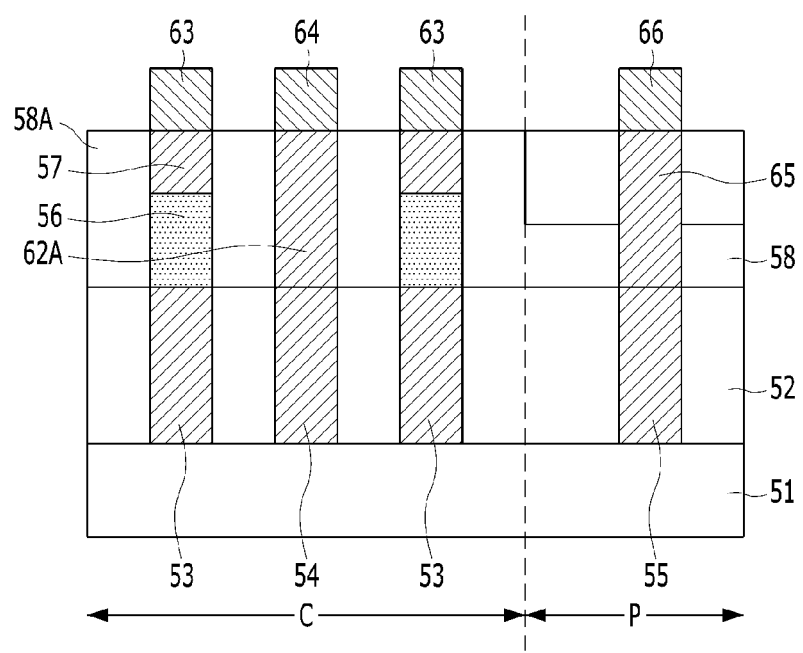

As illustrated in FIG. 6H, first and second conductive lines 63 and 64 may be respectively formed on the stack 56 and the second source line contact 62A in the first region C. The first and the second conductive lines 63 and 64 may be formed through the same process as that illustrated in FIG. 5G.

Thereafter, a fourth contact plug 65 may be formed to penetrate the second dielectric interlayer layer 59 and the spacer 58 in the second region P and a third conductive line 66 may be formed to come in contact with the fourth contact plug 65. The fourth contact plug 65 and the third conductive line 66 have been illustrated as being on the same line as the third contact plug 57 and the first conductive line 63, respectively, but this patent document is not limited thereto. The fourth contact plug 65 and the third conductive line 66 may be located at a different level from the third contact plug 57 and the first conductive line 63 depending on a process.

In accordance with the electronic device including the semiconductor memory and the method for fabricating the same according to the implementations of this patent document, a process can be facilitated and the characteristics of a variable resistance element can be improved.

The above and other memory circuits or semiconductor devices based on the disclosed technology can be used in a range of devices or systems. FIGS. 7-11 provide some examples of devices or systems that can implement the memory circuits disclosed herein.

Figure 7:
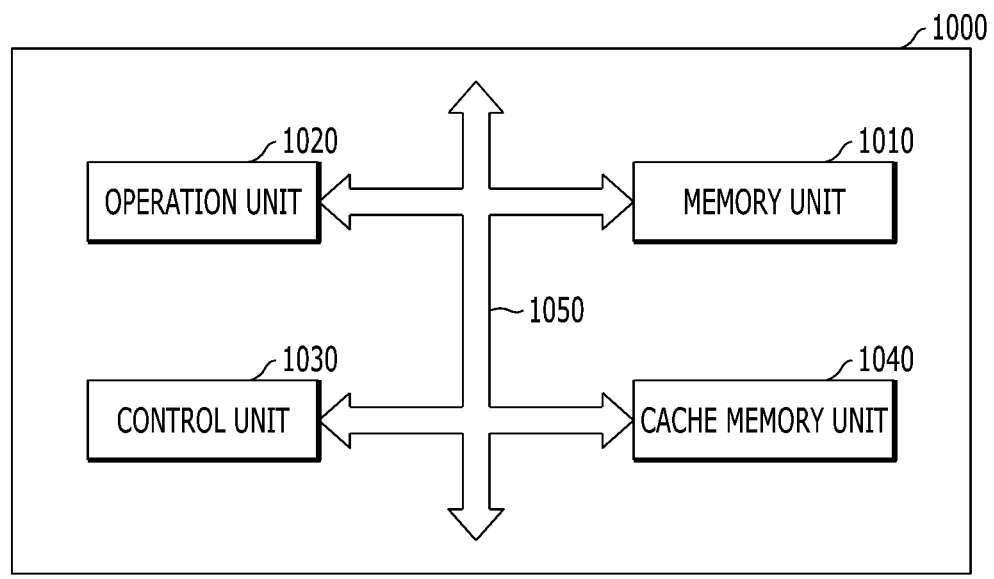
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of variable resistance elements suitable for being formed over a substrate and repeatedly disposed in a matrix type, a spacer pattern suitable for surrounding the variable resistance elements and defining a contact hole between the variable resistance elements in a slant direction, and a source line contact suitable for being buried in the contact hole. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
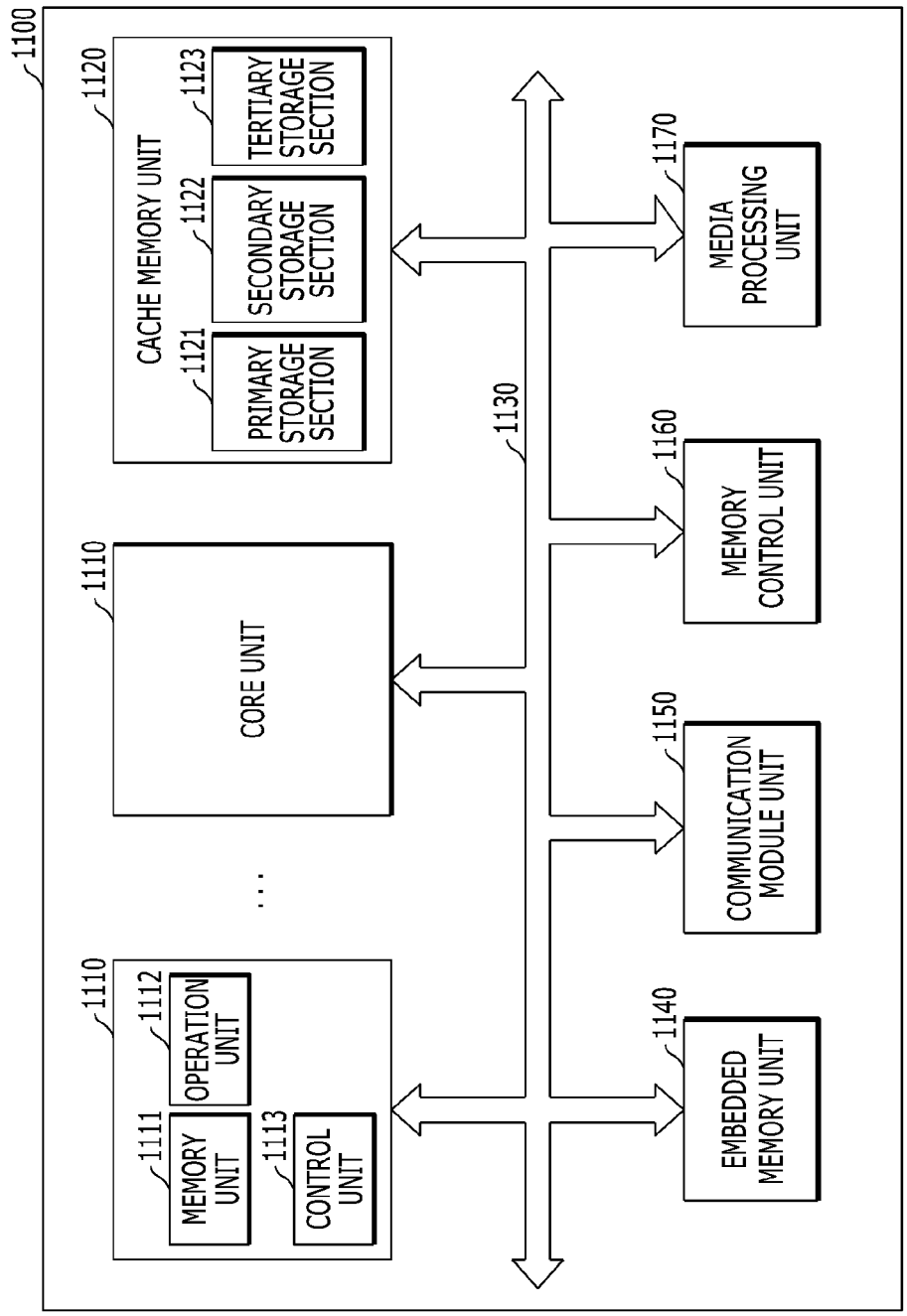
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of variable resistance elements suitable for being formed over a substrate and repeatedly disposed in a matrix type, a spacer pattern suitable for surrounding the variable resistance elements and defining a contact hole between the variable resistance elements in a slant direction, and a source line contact suitable for being buried in the contact hole. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
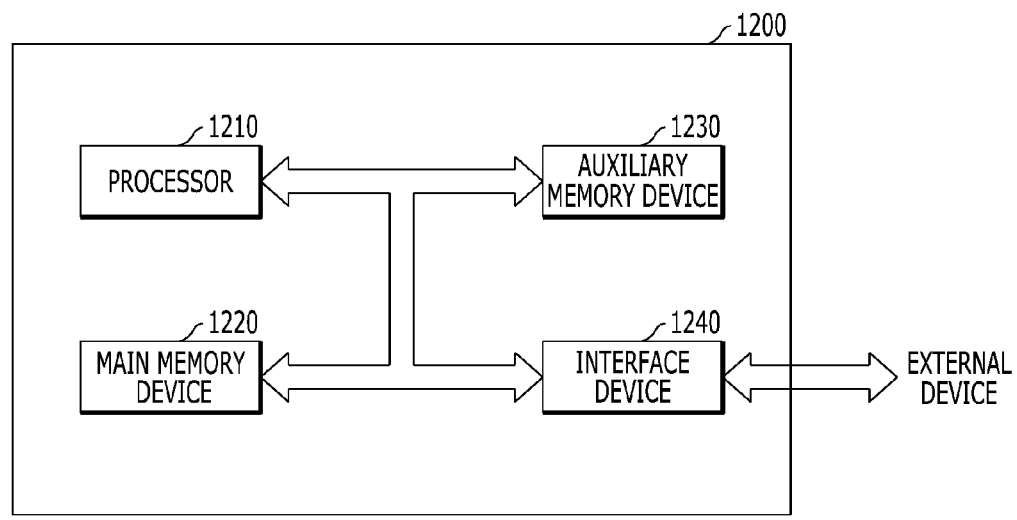
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of variable resistance elements suitable for being formed over a substrate and repeatedly disposed in a matrix type, a spacer pattern suitable for surrounding the variable resistance elements and defining a contact hole between the variable resistance elements in a slant direction, and a source line contact suitable for being buried in the contact hole. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of variable resistance elements suitable for being formed over a substrate and repeatedly disposed in a matrix type, a spacer pattern suitable for surrounding the variable resistance elements and defining a contact hole between the variable resistance elements in a slant direction, and a source line contact suitable for being buried in the contact hole. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
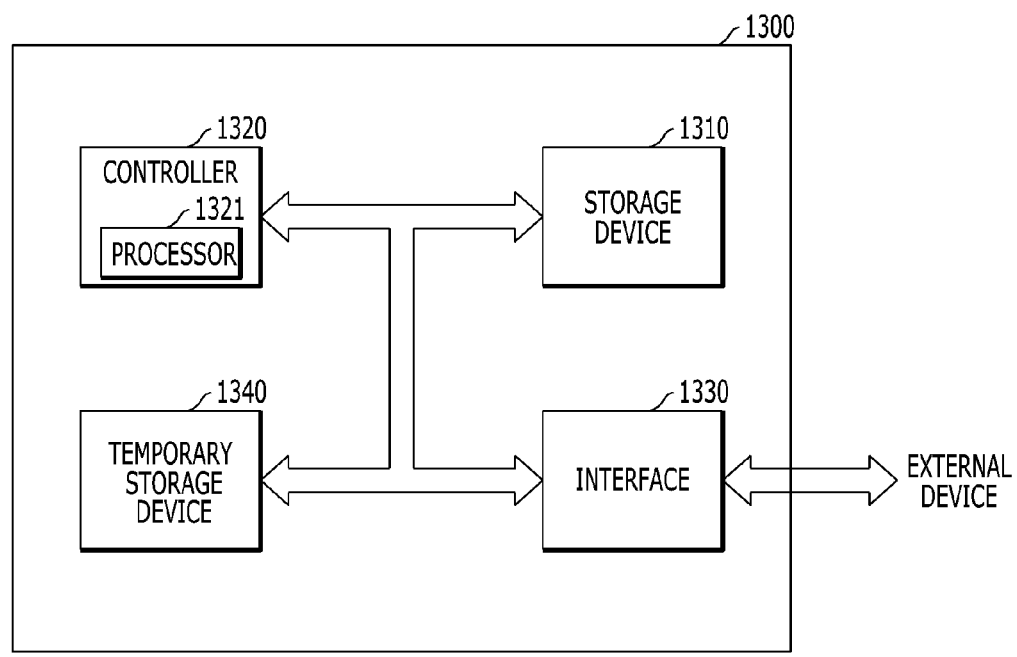
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of variable resistance elements suitable for being formed over a substrate and repeatedly disposed in a matrix type, a spacer pattern suitable for surrounding the variable resistance elements and defining a contact hole between the variable resistance elements in a slant direction, and a source line contact suitable for being buried in the contact hole. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 11:
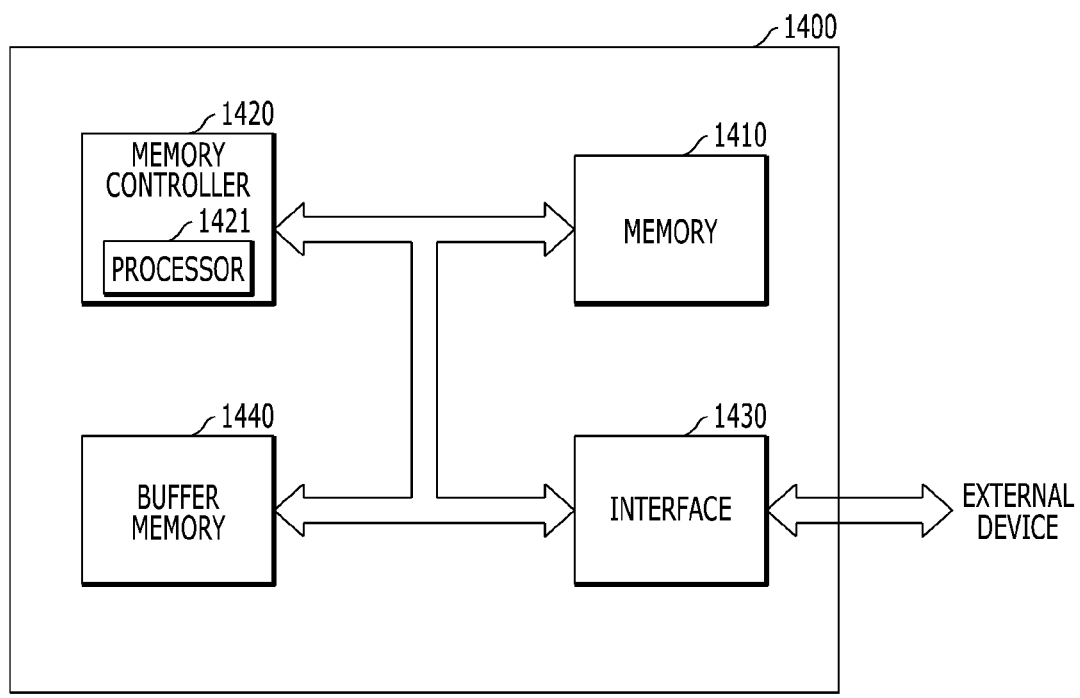
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of variable resistance elements suitable for being formed over a substrate and repeatedly disposed in a matrix type, a spacer pattern suitable for surrounding the variable resistance elements and defining a contact hole between the variable resistance elements in a slant direction, and a source line contact suitable for being buried in the contact hole. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of variable resistance elements suitable for being formed over a substrate and repeatedly disposed in a matrix type, a spacer pattern suitable for surrounding the variable resistance elements and defining a contact hole between the variable resistance elements in a slant direction, and a source line contact suitable for being buried in the contact hole. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a substrate;
   a plurality of variable resistance elements formed over the substrate and arranged as a matrix;
   spacer patterns formed over the substrate to surround the variable resistance elements in the matrix with a thickness sufficient to define contact holes between the variable resistance elements, spacer patterns located apart from the substrate along a direction perpendicular to a surface of the substrate by a distance; and
   a source line contact buried in the contact hole and having a portion located apart from the substrate along the direction by the distance.

2. The electronic device of claim 1, wherein a thickness of the spacer patterns is configured to cover spaces between the variable resistance elements disposed in the matrix type.

3. The electronic device of claim 1, wherein each spacer pattern has a ring type suitable for surrounding the variable resistance elements.

4. The electronic device of claim 1, wherein the spacer patterns comprise nitride.

5. The electronic device of claim 1, wherein the variable resistance elements comprise a circular pillar type.

6. The electronic device of claim 1, wherein the contact hole has a polygonal structure.

7. The electronic device of claim 6, wherein the polygonal structure has a concave plane.

8. The electronic device of claim 1, wherein the variable resistance element comprises transfer metal oxides, metal oxides including perovskite-based substances, phase change substances including chalcogenide-based substances, ferroelectric substances, or ferromagnetic substances.

9. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit that includes the resistance variable element is part of the cache memory unit in the processor.

10. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory unit that includes the resistance variable element is part of the storage device or the temporary storage device in the data storage system.

* * * * *